(12) United States Patent
Lee et al.

(10) Patent No.: US 11,378,889 B2
(45) Date of Patent: Jul. 5, 2022

(54) IMMERSION LITHOGRAPHY SYSTEM AND METHOD OF USING

(71) Applicant: TAIWAN SEMICONDUCTOR MANUFACTURING COMPANY. LTD., Hsinchu (TW)

(72) Inventors: Yung-Yao Lee, Zhubei (TW); Wei Chih Lin, Hsinchu (TW); Chih Chien Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/083,868

(22) Filed: Oct. 29, 2020

(65) Prior Publication Data

US 2022/0137518 A1   May 5, 2022

(51) Int. Cl.
*G03F 7/20* (2006.01)
*H01L 21/027* (2006.01)

(52) U.S. Cl.
CPC ...... *G03F 7/70341* (2013.01); *G03F 7/70725* (2013.01); *H01L 21/0274* (2013.01)

(58) Field of Classification Search
CPC ............ G03F 7/70341; G03F 7/70725; H01L 21/0274
USPC ...................... 355/30, 53; 361/234
See application file for complete search history.

(56) References Cited

U.S. PATENT DOCUMENTS

| | | | |
|---|---|---|---|
| 7,248,332 B2* | 7/2007 | Owen | G03F 7/70916 355/30 |
| 2007/0008508 A1* | 1/2007 | Lin | G03F 7/70808 355/53 |
| 2015/0062772 A1* | 3/2015 | Waite | H01L 21/6833 361/234 |

* cited by examiner

*Primary Examiner* — Hung V Nguyen
(74) *Attorney, Agent, or Firm* — Hauptman Ham, LLP

(57) ABSTRACT

An immersion lithography system includes an immersion hood, wherein the immersion hood includes a lens system. The immersion lithography system further includes a wafer stage, wherein the wafer stage is moveable relative to the immersion hood, and the wafer stage includes an area for receiving a wafer. The immersion lithography system further includes a first particle capture area on the wafer stage outside of the area for receiving the wafer, wherein the first particle capture area includes silicon, silicon nitride oxide or a photoresist material.

20 Claims, 10 Drawing Sheets

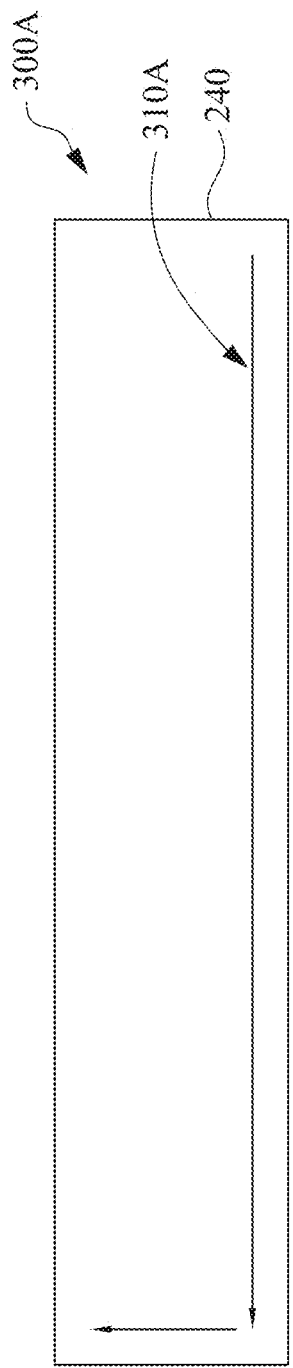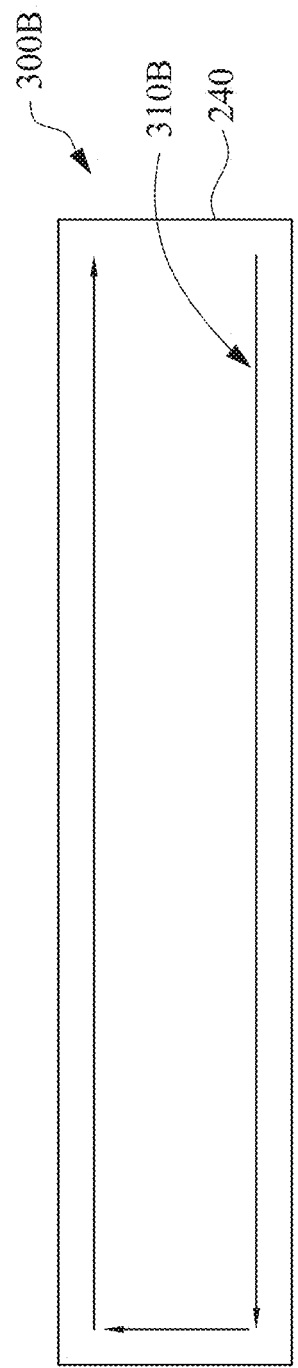
Fig. 3A
Fig. 3B

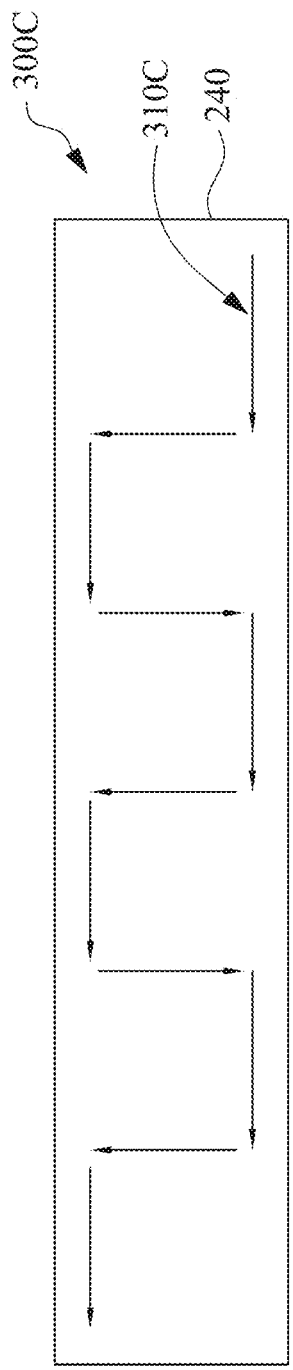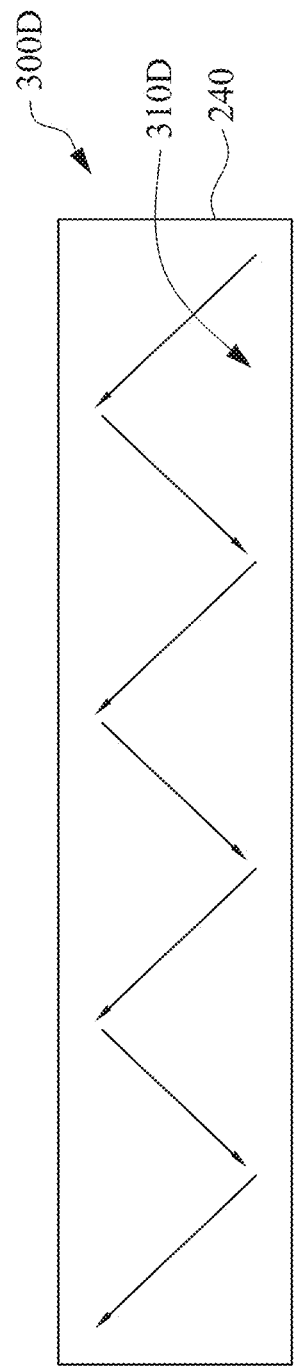

IMMERSION LITHOGRAPHY SYSTEM AND METHOD OF USING

BACKGROUND

As technology nodes shrink, proximity between elements in semiconductor devices increases. A lithography system is used to transfer a pattern from a reticle to a wafer in order to define the location of elements in the semiconductor device. The lithography system directs a light beam to the reticle in order to impart the pattern from the reticle to the light beam. The light beam is then directed to the wafer in order to transfer the pattern to the wafer, for example, using a photoresist material.

Immersion lithography is used to transfer a pattern from the reticle to the wafer for patterns having a line spacing of 90 nanometers (nm) or less. Immersion lithography uses an immersion fluid between a lens system and the wafer in order to reduce magnitudes of changes in refractive index between the lens system and the wafer. Reducing the magnitude of changes in the refractive index helps to avoid refraction or bending of the light used to pattern the wafer. As a result, precision in wafer patterning is increased permitting transfer of patterns to the wafer which have a high density of elements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3F are top views of a routing path along a particle capture region in accordance with some embodiments.

DETAILED DESCRIPTION

Figure 1:
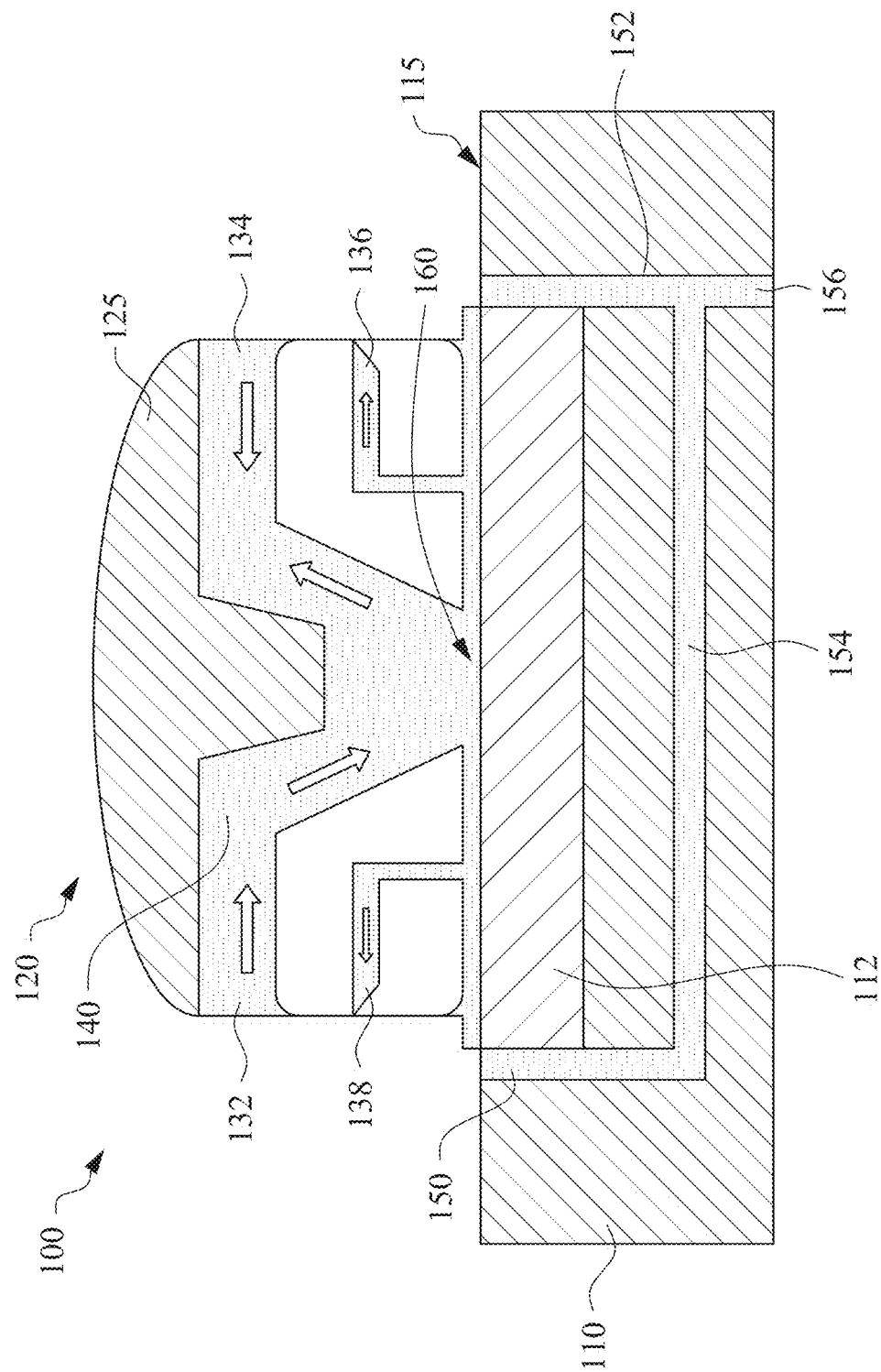
FIG. 1 is a cross sectional view of an immersion lithography system in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Due to the use of an immersion fluid, an immersion lithography system is able to reliably transfer patterns having a spacing density of 90 nanometers (nm) or less. The spacing density is the space between adjacent elements in the pattern. However, the immersion fluid is also prone to convey particles present on a wafer stage over a wafer. Particles over the wafer increase the risk of improper patterning of portions of the wafer. Portions of the wafer that are improperly patterned are more likely to result in non-operational devices in the final product.

A wafer patterning process involves relative movement between a lens system and the wafer. In some embodiments, the lens system is movable relative to the wafer. In some embodiments, the wafer is movable relative to the lens system. In some embodiments, both the lens system and the wafer are moveable. The particles conveyed by the immersion fluid tend to accumulate at a location on the wafer where the lens system is first positioned overlapping the wafer, i.e., by moving the lens system over the wafer or moving the wafer below the lens system. The reason for this accumulation of particles at this location is due to a change in surface properties between a wafer stage, which supports the wafer, and a surface of the wafer being patterned. In some instances, the surface of the wafer stage has hydrophilic characteristics. In some instances, the surface of the wafer being patterned has hydrophobic characteristics. In some instances, the immersion fluid contains water. As a result of the change in surface properties, particles have a tendency to be conveyed onto the wafer by the immersion fluid at the location where the lens system initially overlaps the wafer. The particles obstruct or scatter light from the immersion lithography system, which increases a risk of manufacturing error in the portions of the wafer having particles thereon.

In order to reduce or eliminate the particles being conveyed onto the wafer, the current description includes a particle capture area on the wafer stage. The lens system is made to overlap the particle capture area and traverse a routing path along the particle capture area prior to overlapping the wafer. The particle capture area has surface properties similar to the wafer. As a result, particles conveyed by the immersion fluid are collected on the particle capture area. By capturing the particles on the particle capture area, the number of particles that are later conveyed onto the wafer is reduced or completely avoided. The reduced number of particles on the wafer during wafer patterning improves production yield of a manufacturing process using an immersion lithography system including the particle capture area in comparison with other approaches.

FIG. 1 is a cross-sectional view of an immersion lithography system 100 in accordance with some embodiments. The immersion lithography system 100 includes a wafer stage 110 configured to support a wafer 112. In some embodiments, the wafer stage 110 is movable in a plane parallel to a top surface 115 of the wafer stage 110. An immersion hood 120 is over the wafer stage 110. The immersion hood 120 includes a lens system 125 configured to direct a light beam from a reticle (not shown) to the wafer 112 in order to pattern the wafer. The immersion hood 120 further includes an immersion fluid input port 132 configured to receive an immersion fluid 140. The immersion hood 120 further includes an immersion fluid output port 134 configured to output the immersion fluid 140. The immersion hood 120 further includes apertures 136 and 138 which are also configured to output the immersion fluid 140. Ends of the apertures 136 and 138 are shown as cut off for the sake of simplicity. One of ordinary skill in the art would recognize that the apertures 136 and 138 are configured to convey the immersion fluid 140 out of the immersion hood 120. The wafer stage 110 further includes suck back lines 150, 152 and 154 configured to drain the immersion fluid on the top surface 115 of the wafer stage 110. A drain 156 permits the suck back lines 150, 152 and 154 to dispense the immersion fluid 140. The immersion fluid 140 is between the lens system 125 and the wafer 112 in order to increase precision of patterning the wafer 112. A gap 160 exists between a bottom most surface of the immersion hood 120 and a top surface of the wafer 112 or the top surface 115 of the wafer stage 110. The immersion fluid 140 is within the gap 160.

The wafer stage 110 supports the wafer 112 during a patterning process. In some embodiments, the wafer stage 110 holds the wafer 112 in place using a vacuum chuck (not shown). In some embodiments, the wafer stage 110 is attached to a motor in order to adjust the position of the wafer stage 110 relative to the immersion hood 120. In some embodiments, the motor includes a stepper motor, a rack and pinion motor, a piezoelectric motor, a servo motor or another suitable motor. In some embodiments, the wafer stage 110 is configured to translate in a plane parallel to the top surface 115. In some embodiments, the wafer stage 110 is configured to rotate about an axis perpendicular to the top surface 115. In some embodiments, the wafer stage 110 is configured to rotate about an axis parallel to the top surface 115. One of ordinary skill in the art would recognize that combinations of these movements are within the scope of this disclosure. In some embodiments, a speed of moving the wafer stage 110 is greater than 0.001 millimeters/second (mm/s). In some embodiments, the speed of moving the wafer stage 110 ranges from about 0.001 mm/s to about 1 mm/s. If the speed of moving the wafer stage 110 is too high, then a risk of pushing particles onto the wafer 112 due to splashing of the immersion fluid 140 increases, in some instances. If the speed of moving the wafer stage 110 is too low, then a risk that the particles are captured by a particle capture area (described below) is increased, in some instances. The particle capture area is described in detail below. The particle capture area is a region of the top surface 115 having surface properties different from other portions of the top surface 115.

A portion of the wafer stage 110 for supporting the wafer 112 is recessed with respect to the top surface 115 so that the top surface of the wafer 112 is substantially co-planar with the top surface 115. An offset, if any, between the top surface 115 and the top surface of the wafer 112 is a result of a number of layers on the wafer. For example, during formation of elements close to a substrate of the wafer 112, an overall thickness of the wafer 112 is less than the overall thickness of the wafer 112 during formation of elements farther from the substrate.

In some embodiments, sensors (see FIGS. 2A-2C) are in the top surface 115. In some embodiments, the top surface 115 includes mirror portions for reflecting light from the lens system 125. Portions of the top surface 115 have hydrophilic characteristics which allow the immersion fluid 140 to spread across the top surface 115.

The wafer 112 is supported by the wafer stage 110. The wafer 112 is patterned by a light beam emitted from the lens system 125 through the immersion fluid 140 and then incident on the wafer 112. This light beam changes a chemical property of a top-most layer on the wafer 112. In some embodiments, the top-most layer of the wafer 112 includes a photoresist material. In some embodiments, the top-most layer of the wafer 112 includes silicon. In some embodiments, the wafer 112 is placed on and/or removed from the wafer stage 110 using a robot arm (not shown).

The immersion hood 120 is configured to introduce the immersion fluid 140 into the gap 160 between the immersion hood 120 and the wafer stage 110, and to emit the light beam from the lens system 125 for patterning the wafer 112. In some embodiments, the immersion hood 120 is stationary. In some embodiments, the immersion hood is capable of translational movement in a plane parallel to the top surface 115. In some embodiments, a motor is used to translate the immersion hood 120. In some embodiments, the motor includes a stepper motor, a rack and pinion motor, a piezoelectric motor, a servo motor or another suitable motor. In some embodiments, the motor usable for moving the immersion hood 120 is a same type of motor as that usable for moving the wafer stage 110. In some embodiments, the motor usable for moving the immersion hood 120 is a different type of motor from that useable for moving the wafer stage 110.

The lens system 125 is configured to control propagation of a light beam from a light source (not shown) to the reticle and then to the wafer 112. In some embodiments, the light source is configured to emit the light beam, such as an ultraviolet (UV) or extreme UV (EUV) light source. In some embodiments, the light source includes a mercury lamp having a wavelength of 436 nm (G-line) or 365 nm (I-line); a Krypton Fluoride (KrF) excimer laser with a wavelength of 248 nm; an Argon Fluoride (ArF) excimer laser with a wavelength of 193 nm; a Fluoride (F2) excimer laser with a wavelength of 157 nm; or other light sources having a desired wavelength (e.g., below approximately 100 nm). In some embodiments, the lens system 125 is free of mirrors. In some embodiments, the lens system 125 is a catadioptric system. In some embodiments, the lens system 125 is replaced with a catoptric system.

The immersion fluid input port 132 is configured to receive the immersion fluid 140 from a supply (not shown) and provide the immersion fluid 140 to the gap 160. The immersion fluid input port 132 is connected to a controllable pump (not shown) to control a flow rate and a pressure of the immersion fluid 140 through the immersion hood 120. In some embodiments, the flow rate of the immersion fluid 140 through the immersion fluid input port 132 ranges from about 1 liter/minute (L/min) to about 4 L/min. If the flow rate of the immersion fluid 140 is too low, then the immersion fluid 140 is unable to move the particles from the wafer stage 110 to the particle capture area, in some instances. If the flow rate of the immersion fluid 140 is too high, a risk of the immersion fluid 140 causing the particles to wash onto the wafer 112 increases, in some instances. In some embodiments, the pressure of the immersion fluid 140 passing through the immersion fluid input port 132 is less than or equal to 70 kiloPascals (kPa). In some embodiments, the pressure of the immersion fluid 140 passing through the immersion fluid input port 132 ranges from about 10 kPa to about 70 kPa. If the pressure of the immersion fluid 140 is too high, a risk of damaging the wafer 112 during the wafer patterning process increases, in some instances. If the pressure of the immersion fluid 140 is too low, the immersion fluid 140 will not move the particles from the wafer stage 110 to the particle capture area, in some instances.

The immersion fluid output port 134 is configured to allow the immersion fluid 140 to flow out of the immersion hood 120. In some instances, the immersion fluid 140 exiting the immersion fluid output port 134 is collected in a reservoir. In some embodiments, the immersion fluid 140 exiting the immersion fluid output port 134 is recycled and is re-introduced to the immersion hood 120 through the immersion fluid input port 132. In some embodiments, the immersion fluid 140 exiting the immersion fluid output port 132 is filtered or otherwise treated prior to being recycled.

The apertures 136 and 138 are similar to the immersion fluid output port 134, but include openings on a bottom most surface of the immersion hood 120. In some instances, the immersion fluid 140 exiting at least one of the apertures 136 or 138 is collected in a reservoir. In some embodiments, the immersion fluid 140 exiting either of the apertures 136 or 138 is recycled and is re-introduced to the immersion hood 120 through the immersion fluid input port 132. In some embodiments, the immersion fluid 140 exiting either of the apertures 136 or 138 is filtered or otherwise treated prior to being recycled. In some embodiments, at least one of the apertures 136 or 138 is fluidly connected to the immersion fluid output port 134.

The immersion fluid 140 is used to reduce refractive index differences between the lens system 125 and air. When a light beam moves from one medium to another medium with a different refractive index the light beam is refracted, i.e., bent, and/or reflected. Refracting of the light beam reduces precision of the location of the light beam on the wafer 112. Including the immersion fluid 140 reduces the amount of refraction, which increases the precision of the location of the light beam exiting the lens system 125 on the wafer 112. In some embodiments, the immersion fluid 140 has a refractive index of 1.44 or more at a wavelength of 193 nm. In some embodiments, the immersion fluid 140 includes water. In some embodiments, the immersion fluid 140 includes deionized water (DIW). In some embodiments, the immersion fluid 140 includes a water-based solution including an additive such as acid, salt or a polymer. In some embodiments, the immersion fluid 140 includes a gas.

The wafer stage 110 includes suck back lines 150, 152 and 154 configured to remove portions of the immersion fluid 140 in the gap 160. The suck back line 150 is on a first side of the wafer 112. The suck back line 152 is on a second side of the wafer 112 opposite to the first side. The suck back line 154 connects the suck back lines 150 and 152 below the wafer 112. The suck back lines 150, 152 and 154 are connected to the drain 156 for removing the immersion fluid 140 from the suck back lines 150, 152 and 154. In some instances, the immersion fluid 140 exiting the drain 156 is collected in a reservoir. In some embodiments, the immersion fluid 140 exiting the drain 156 is recycled and is re-introduced to the immersion hood 120 through the immersion fluid input port 132. In some embodiments, the immersion fluid 140 exiting the drain 156 is filtered or otherwise treated prior to being recycled. In some embodiments, the drain 156 is connected to the immersion fluid output port 132 or at least one of the apertures 136 or 138. In some embodiments, the suck back line 154 is omitted and each of the suck back lines 150 and 152 extends to a back surface of the wafer stage 110 to a drain, e.g., the drain 156.

Figure 2A:
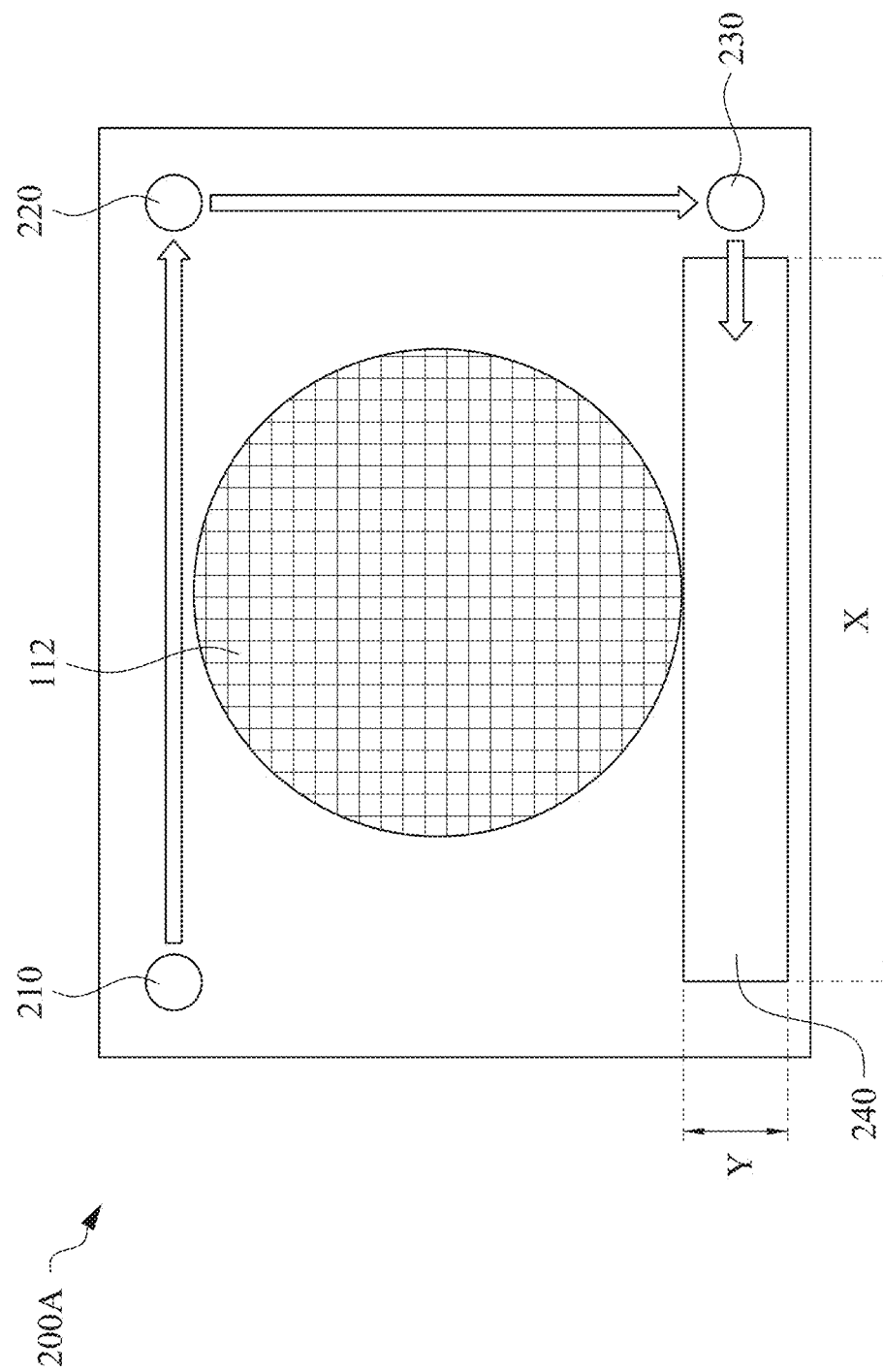
FIGS. 2A-2C are top views of a wafer stage in accordance with some embodiments.

FIG. 2A is a top view of a wafer stage 200A in accordance with some embodiments. The wafer stage 200A is usable as wafer stage 110 in immersion lithography system 100 (FIG. 1). The wafer 112 is supported by the wafer stage 200A. The wafer stage 200A includes a first sensor 210 at a first corner of the wafer stage 200A. The wafer stage 200A includes a second sensor 220 at a second corner of the wafer stage 200A. The wafer stage 200A includes a third sensor 230 at a third corner of the wafer stage 200A. The wafer stage 200A further includes a particle capture area 240. The particle capture area 240 has a dimension X in a first direction and a dimension Y in a second direction perpendicular to the first direction. The particle capture area 240 is separated from the wafer and each of the sensors 210, 220 and 230. FIG. 2A includes arrows indicating a path of an immersion hood, e.g., the immersion hood 120 (FIG. 1), over the wafer stage 200A. As noted above, the relative movement of the immersion hood and the wafer stage 200A is achievable by movement of the wafer stage 200A or the immersion hood.

The immersion hood moves from the first sensor 210 to the second sensor 220 and then the third sensor 230 in order to calibrate the immersion hood to determine the relative position between the immersion hood and the wafer stage 200A. In some embodiments, at least one of the first sensor 210, the second sensor 220 or the third sensor 230 includes a focus sensor in order to determine whether a lens system, e.g., the lens system 125 (FIG. 1), of the immersion hood is properly focused. In some embodiments, at least one of the first sensor 210, the second sensor 220 or the third sensor 230 includes an overlay error sensor in order to determine a relative position between the wafer stage 200A and the immersion hood. In some embodiments, at least one of the first sensor 210, the second sensor 220 or the third sensor 230 includes an energy sensor in order to determine an intensity of the light beam exiting the immersion hood. In some embodiments, the first sensor 210 is a same sensor as each of the second sensor 220 and the third sensor 230. In some embodiments, the first sensor 210 is different from at least one of the second sensor 220 or the third sensor 230. In some embodiments, the second sensor 220 is different from the third sensor 230. In some embodiments, at least one of the first sensor 210, the second sensor 220 or the third sensor 230 is in a location other than a corner of the wafer stage 200A. The location of the sensors 210, 220 and 230 are not particularly limited, so long as the sensors do not overlap with the wafer 112 or the particle capture area 240.

The particle capture area 240 extends along the surface, e.g., top surface 115 (FIG. 1), of the wafer stage 200A. After calibrating the immersion hood by overlapping each of the sensors 210, 220 and 230 with the immersion hood, the immersion hood travels along the particle capture area 240. The particle capture area 240 is formed by depositing a layer of material over the wafer stage 200A. The material has similar surface characteristics as the wafer 112. The similar surface characteristics help the particle capture area 240 to collect particles from the immersion hood accumulated during the calibration movement. By collecting the particles on the particle capture area 240, the particles are not conveyed onto the wafer 112 and production yield of the wafer 112 increases.

In some embodiments, the material includes silicon or silicon nitride oxide. In some embodiments, the material includes a photoresist material or another suitable material. In some embodiments, the dimension X is greater than or equal to 26 millimeters (mm). If the dimension X is too small, then a risk of particles being conveyed onto the wafer 112 increases, in some instances. In some embodiments, the dimension Y is greater than or equal to 33 mm. If the dimension Y is too small, then a risk of particles being conveyed onto the wafer 112 increases, in some instances.

In some embodiments, the dimension X is less than 26 mm or the dimension Y is less than 33 mm depending on a routing path of the immersion hood over the particle capture area 240. The routing path is the track which the immersion hood follows over the particle capture area 240. As a length of the routing path increases, dimensions of the particle capture area 240 decrease, in some embodiments. In some embodiments, a minimum routing path length in the first direction is 26 mm. In some embodiments, a minimum routing path length in the second direction is 33 mm. If the routing path length in the first direction is too small, then a risk of particles being conveyed onto the wafer 112 increases, in some instances. If the routing path length in the second direction is too small, then a risk of particles being conveyed onto the wafer 112 increases, in some instances. Some embodiments of the routing path are described in detail with respect to FIGS. 3A-3F.

Figure 2B:
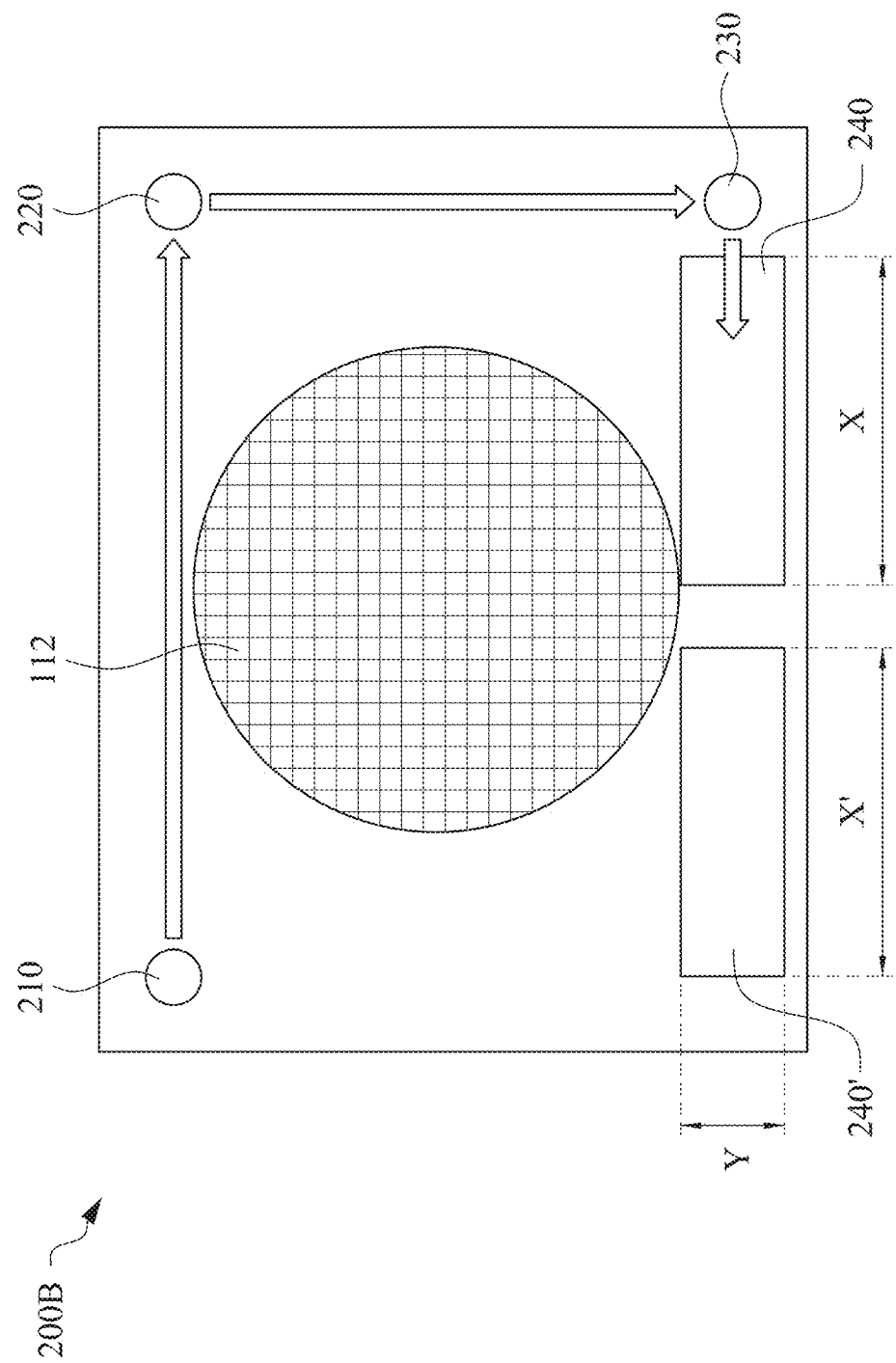

FIG. 2B is a top view of a wafer stage 200B in accordance with some embodiments. The wafer stage 200B is similar to wafer stage 200A (FIG. 2A). In comparison with wafer stage 200A, the wafer stage 200B includes an additional particle capture area 240'. The particle capture area 240' is along a same side of the wafer stage 200B as the particle capture area 240. The particle capture area 240' has a same dimension Y in the second direction as the particle capture area 240. In some embodiments, the particle capture area 240' has a different dimension in the second direction from the particle capture area 240. The particle capture area 240' has a dimension X' in the first direction. In some embodiments, the dimension X' is equal to the dimension X. In some embodiments, the dimension X' is different from the dimension X. In some embodiments, the dimension X' is greater than or equal to 26 mm. If the dimension X' is too small, then a risk of particles being conveyed onto the wafer 112 increases, in some instances. In some embodiments, the dimension X' is less than 26 mm depending on a length of the routing path over particle capture area 240'. In some embodiments, the particle capture area 240' includes a same material as the particle capture area 240. In some embodiments, the particle capture area 240' includes a different material from a material in the particle capture area 240.

In some embodiments, the immersion hood is routed over both the particle capture area 240 and the particle capture area 240'. In some embodiments, the immersion hood is routed over only one of the particle capture area 240 or the particle capture area 240'. Selection of the routing of the immersion hood is based on a material a top-most layer of the wafer 112, in some embodiments. The immersion hood is routed over the particle capture area 240 or the particle capture area 240' having surface characteristics most similar to the surface characteristics of the top-most layer of the wafer 112.

By including the particle capture area 240', the wafer stage 200B includes additional changes of interfaces between the immersion hood and the wafer stage 200B. As described above, the changes in interfaces is a cause in deposition or adherence of particles to the underlying surface. By increasing the number of interface changes, the wafer stage 200B is able to decrease the likelihood of particles being conveyed onto the wafer 112. Wafer stage 200B includes two particle capture areas; however, one of ordinary skill in the art would recognize that more than two particle capture areas would be possible based on this disclosure.

Figure 2C:
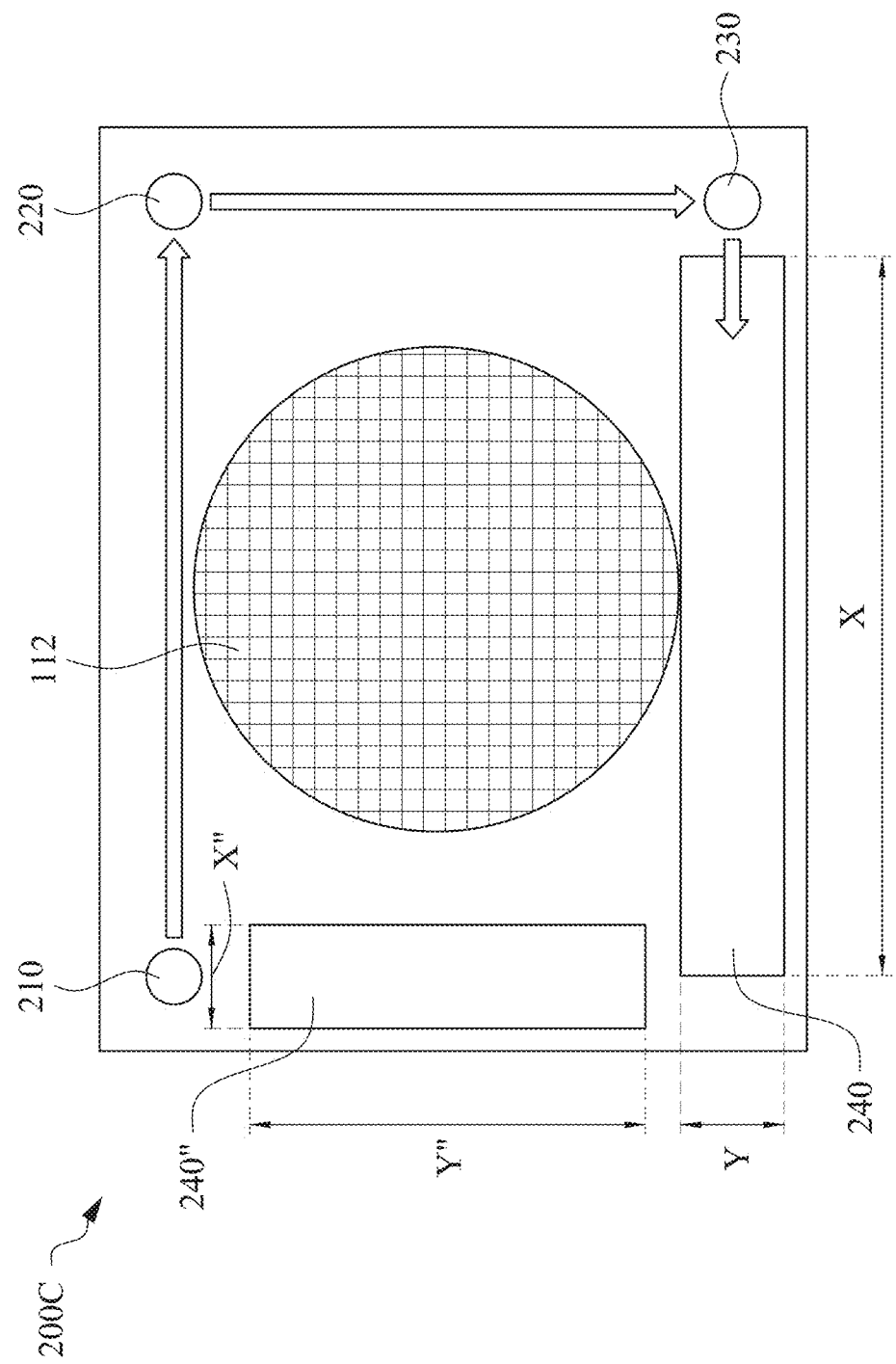

FIG. 2C is a top view of a wafer stage 200C in accordance with some embodiments. The wafer stage 200C is similar to wafer stage 200A (FIG. 2A). In comparison with wafer stage 200A, the wafer stage 200C includes an additional particle capture area 240". The particle capture area 240" is along a different side of the wafer stage 200C from the particle capture area 240. The particle capture area 240" has a dimension Y" in the second direction. In some embodiments, the dimension Y" is equal to the dimension Y. In some embodiments, the dimension Y" is different from the dimension Y. In some embodiments, the dimension Y" is greater than or equal to 33 mm. If the dimension Y" is too small, then a risk of particles being conveyed onto the wafer 112 increases, in some instances. In some embodiments, the dimension Y" is less than 33 mm depending on a length of the routing path over particle capture area 240". The particle capture area 240" has a dimension X" in the first direction. In some embodiments, the dimension X" is equal to the dimension X. In some embodiments, the dimension X" is different from the dimension X. In some embodiments, the dimension X" is greater than or equal to 26 mm. If the dimension X" is too small, then a risk of particles being conveyed onto the wafer 112 increases, in some instances. In some embodiments, the dimension X" is less than 26 mm depending on a length of the routing path over particle capture area 240". In some embodiments, the particle capture area 240" includes a same material as the particle capture area 240. In some embodiments, the particle capture area 240" includes a different material from a material in the particle capture area 240.

In some embodiments, the immersion hood is routed over both the particle capture area 240 and the particle capture area 240". In some embodiments, the immersion hood is routed over only one of the particle capture area 240 or the particle capture area 240". Selection of the routing of the immersion hood is based on a material of a top-most layer of the wafer 112, in some embodiments. The immersion hood is routed over the particle capture area 240 or the particle capture area 240" having surface characteristics most similar to the surface characteristics of the top-most layer of the wafer 112.

By including the particle capture area 240", a controller is able to select a routing path for the immersion hood over the wafer stage 200C to move the immersion hood over the particle capture area, i.e., particle capture area 240 or particle capture area 240", which has surface characteristics most closely resembling the surface characteristics of the wafer 112. By using the particle capture area having surface characteristics most closely resembling the wafer 112, a risk of particles being conveyed onto the wafer 112 is reduced. For example, in some embodiments, where the surface characteristics of the wafer 112 most closely resemble particle capture area 240", the immersion hood will be routed around particle capture area 240 to particle capture area 240". The routing path of the immersion hood will not pass over the wafer 112 prior to passing over the particle capture area regardless of which particle capture area is within the routing path of the immersion hood. In some embodiments, the immersion hood passes over both the particle capture area 240 and the particle capture area 240".

FIG. 3A is a top view of a routing path 300A along a particle capture area 240 in accordance with some embodiments. The routing path 300A includes a track 310A which has an L-shape. A total length of the track 310A in a first direction is at least 26 mm in order to reduce the risk of particles being conveyed onto a wafer, e.g., the wafer 112 (FIGS. 1 and 2A-2C). A total length of the track 310A in a second direction, perpendicular to the first direction is at least 33 mm in order to reduce the risk of particles being conveyed onto the wafer, e.g., the wafer 112. Since the track 310A includes a single leg in the first direction and a single leg in the second direction, an overall size of the particle capture area 240 is at least 26 mm in the first direction and at least 33 mm in the second direction in order to accommodate the minimum track length in each direction for the track 310A.

FIG. 3B is a top view of a routing path 300B along a particle capture area 240 in accordance with some embodiments. The routing path 300B includes a track 310B. The track 310B is similar to the track 310A. In comparison with the track 310A, the track 310B has a U-shape. The track 310B has two legs in the first direction with the two legs being oriented 180-degrees with respect to one another. Since the track 310B has two legs in the first direction, an overall size of the particle capture area 240 for the track 310B is reduced in comparison with the particle capture area 240 for track 310A, in some embodiments. In some embodiments, for tracks having a number N of multiple legs oriented 180-degrees with respect to one another and parallel to an edge of the particle capture area 240, a minimum dimension of the corresponding particle capture area 240 is equal to Ldx/N, where Ldx is the minimum length dimension in the corresponding direction. For example, in some embodiments, a minimum dimension of the particle capture area 240 in the first direction for the track 310B is 13 mm (26 mm/2). In some embodiments, the particle capture area 240 is larger than the minimum dimensions.

FIG. 3C is a top view of a routing path 300C along a particle capture area 240 in accordance with some embodiments. The routing path 300C includes a track 310C. The track 310C is similar to the track 310A. In comparison with the track 310A, the track 310C has an S-shape. The track 310C has multiple legs in the first direction. However, since none of the legs in the first direction are oriented 180-degree from one another, the minimum dimension of the particle capture area 240 for the track 310C in the first direction is 26 mm, in some embodiments. The track 310C has 5 legs in the second direction that are oriented 180-degrees from each other. Therefore, in some embodiments, a minimum dimension of the particle capture area 240 for the track 310C in the second direction is 6.6 mm (33 mm/5).

FIG. 3D is a top view of a routing path 300D along a particle capture area 240 in accordance with some embodiments. The routing path 300D includes a track 310D. The track 310D is similar to the track 310C. In comparison with the track 310C, the track 310D has a sawtooth-shape. The track 310D has multiple legs oriented 180-degree from one another. However, the legs of the track 310D are angled with respect to the edges of the particle capture area 240. The minimum dimensions in each of the first direction and the second direction for the particle capture area 240 for the track 310D depends on an angle of the legs of the track 310D. The minimum dimensions of the particle capture area 240 are set so that a total distance of the track 310D in the first direction is at least 26 mm and at least 33 mm in the second direction, in some embodiments.

Figure 3E:
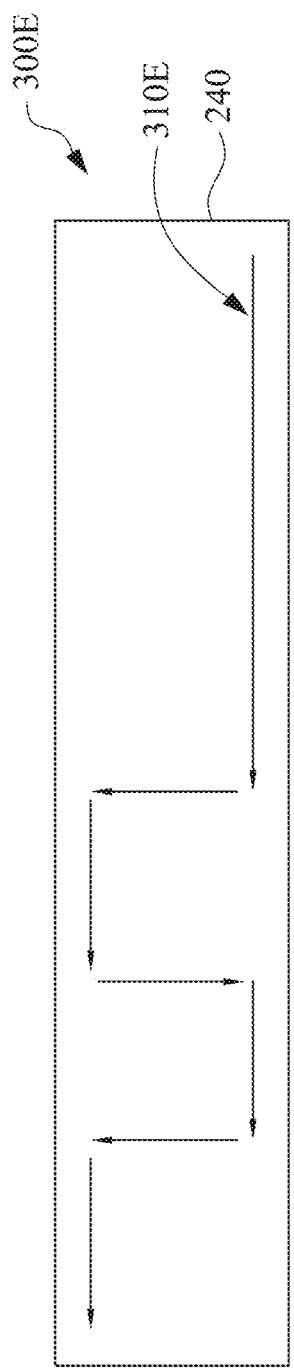

FIG. 3E is a top view of a routing path 300E along a particle capture area 240 in accordance with some embodiments. The routing path 300E includes a track 310E. The track 310E is similar to the track 310C. In comparison with the track 310C, the track 310E has an S-shape where one of the legs in the first direction is longer than another of the legs in the first direction. The minimum dimensions of the particle capture area 240 are set so that a total distance of the track 310E in the first direction is at least 26 mm and at least 33 mm in the second direction, in some embodiments.

Figure 3F:
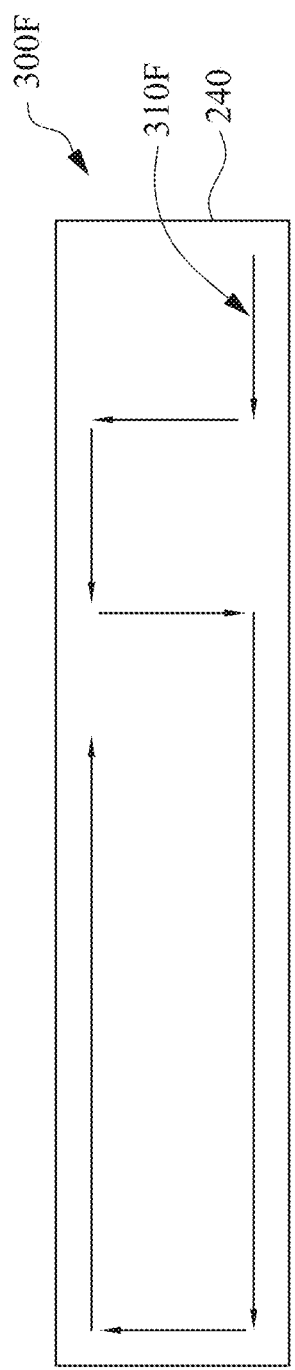

FIG. 3F is a top view of a routing path 300F along a particle capture area 240 in accordance with some embodiments. The routing path 300F includes a track 310F. The track 310F is similar to a combination of the track 310B and the track 310C. The track 310F has a first portion having an S-shape and a second portion having a U-shape. The minimum dimensions of the particle capture area 240 are set so that a total distance of the track 310E in the first direction is at least 26 mm and at least 33 mm in the second direction, in some embodiments.

One of ordinary skill in the art would recognize that FIGS. 3A-3F are merely examples for the routing paths and that additional routing path shapes are within the scope of this disclosure.

Figure 4:
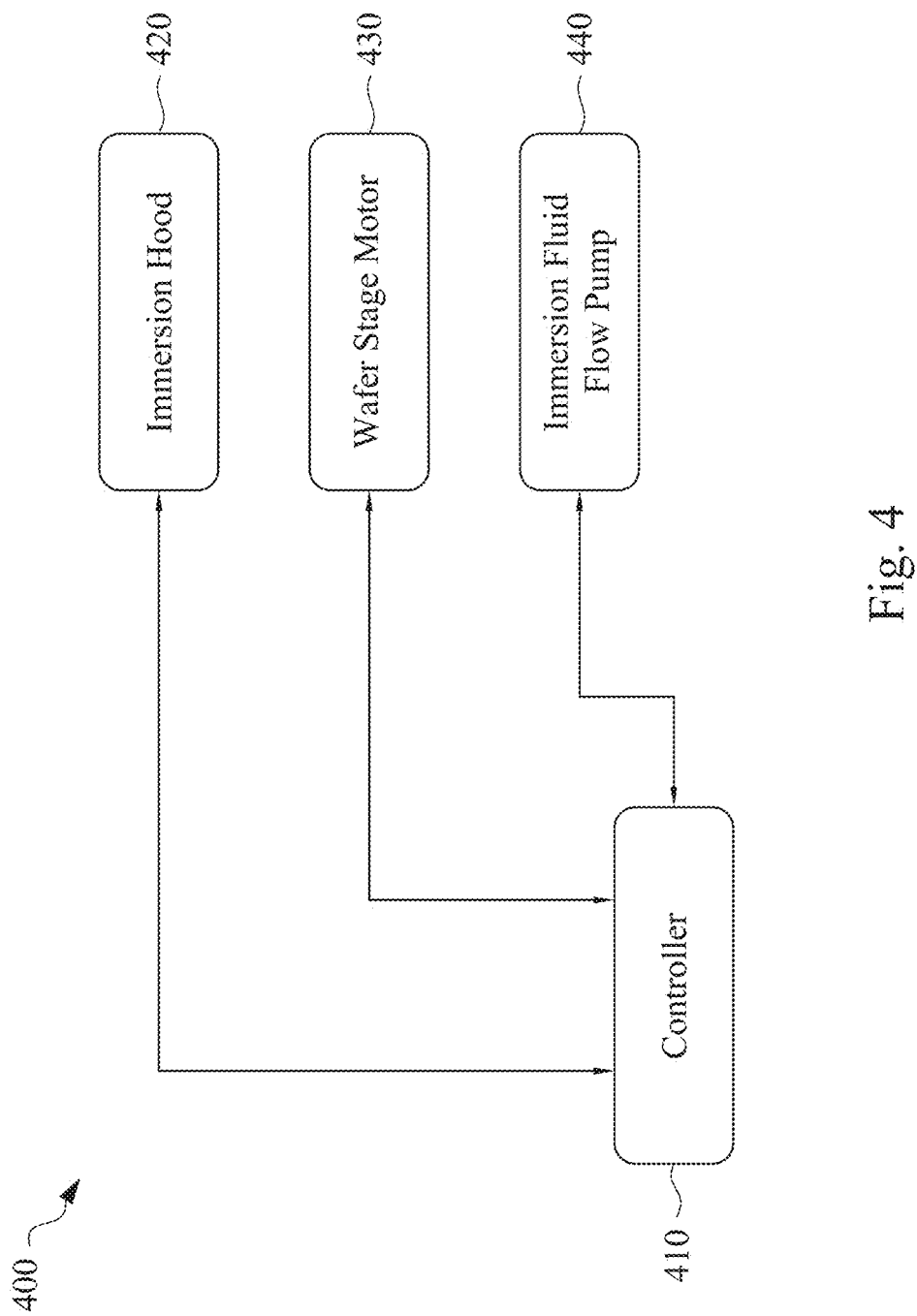
FIG. 4 is a schematic view of a system for controlling an immersion lithography system in accordance with some embodiments.

FIG. 4 is a schematic view of a system 400 for controlling an immersion lithography system in accordance with some embodiments. System 400 includes a controller 410. The controller 410 communicates with an immersion hood 420, a wafer stage motor 430 and an immersion fluid flow motor 440. In some embodiments, the controller 410 communicates using a wired connection. In some embodiments, the controller communicates using a wireless connection.

The controller 410 is configured to control different portions of the immersion lithography system in order to direct the immersion hood 420 to overlap with at least one particle capture area on a wafer stage connected to the wafer stage motor 430. The controller 410 controls at least one of the immersion hood 420 or the wafer stage motor 430 in order to control the relative position of the immersion hood 420 over the wafer stage. In some embodiments, the controller 410 is configured to control movement of the immersion hood 420. In some embodiments, the controller 410 is configured to control operation of the wafer stage motor 430. In some embodiments, the controller 410 is configured to control movement of the immersion hood 420 and the operation of the wafer stage motor 430. In some embodiments, the controller 410 receives information about a type of wafer, e.g., the wafer 112 (FIGS. 1 and 2A-2C), to be patterned and determines which particle capture area on the wafer stage has surface characteristics most closely resembling the surface characteristics of the wafer. The controller 410 then controls the immersion hood 420 and/or the wafer stage motor 430 to cause the immersion hood 420 to overlap the determined particle capture area. The controller 410 also receives information related to a size of each of the particle capture areas on the wafer stage and determines a routing path, e.g., routing path 300A-300F (FIGS. 3A-3F), for the immersion hood 420 over the corresponding particle capture area in order to reduce the risk of particles being conveyed onto the wafer. The controller 410 selects the routing path to travel a minimum distance over the particle capture area in each of a first direction and a second direction, as described above.

The controller 410 is further configured to control the immersion fluid flow motor 440. The controller 410 controls the immersion fluid flow motor 440 in order set the flow rate and pressure of the immersion fluid from the immersion hood 420.

The controller 410 is configured to receive information, e.g., from sensors 210, 220 and 230 (FIGS. 2A-2C), in order to determine a location of the immersion hood 420 relative to the wafer stage. In some embodiments, the controller 410 is further configured to receive information, e.g., from a flow meter, to measure a flow rate and/or a pressure of the immersion fluid flowing from the immersion hood 420. Based on this information, the controller 410 is able to control different components of the system 400 in order to reduce the risk of particles being conveyed onto the wafer. As a result, production yield of the wafer is increased.

The immersion hood 420, e.g., immersion hood 120 (FIG. 1), conveys a patterned light beam to the wafer, e.g., the wafer 112, on the wafer stage and conveys immersion fluid to the wafer stage. In some embodiments, the immersion hood 420 is stationary. In some embodiments, the immersion hood 420 is moveable.

The wafer stage motor 430 is configured to move the wafer stage, e.g., the wafer stage 110 (FIG. 1), in a plane parallel to a top surface of the wafer stage. In some embodiments, the wafer stage motor 430 includes multiple motors. For example, in some embodiments, the wafer stage motor 430 includes a first motor for movement in a first direction and a second motor for movement in a second direction perpendicular to the first direction. In some embodiments, the wafer stage motor 430 includes a stepper motor, a rack and pinion motor, a piezoelectric motor, a servo motor or another suitable motor.

The immersion fluid flow motor 440 is configured to control the flow of immersion fluid, e.g., immersion fluid 140 (FIG. 1), from the immersion hood 420 to the wafer stage. In some embodiments, the immersion fluid flow motor 440 is part of the immersion hood 420. In some embodiments, the immersion fluid flow motor 440 is a piezoelectric motor, a servo motor or another suitable motor.

Figure 5:
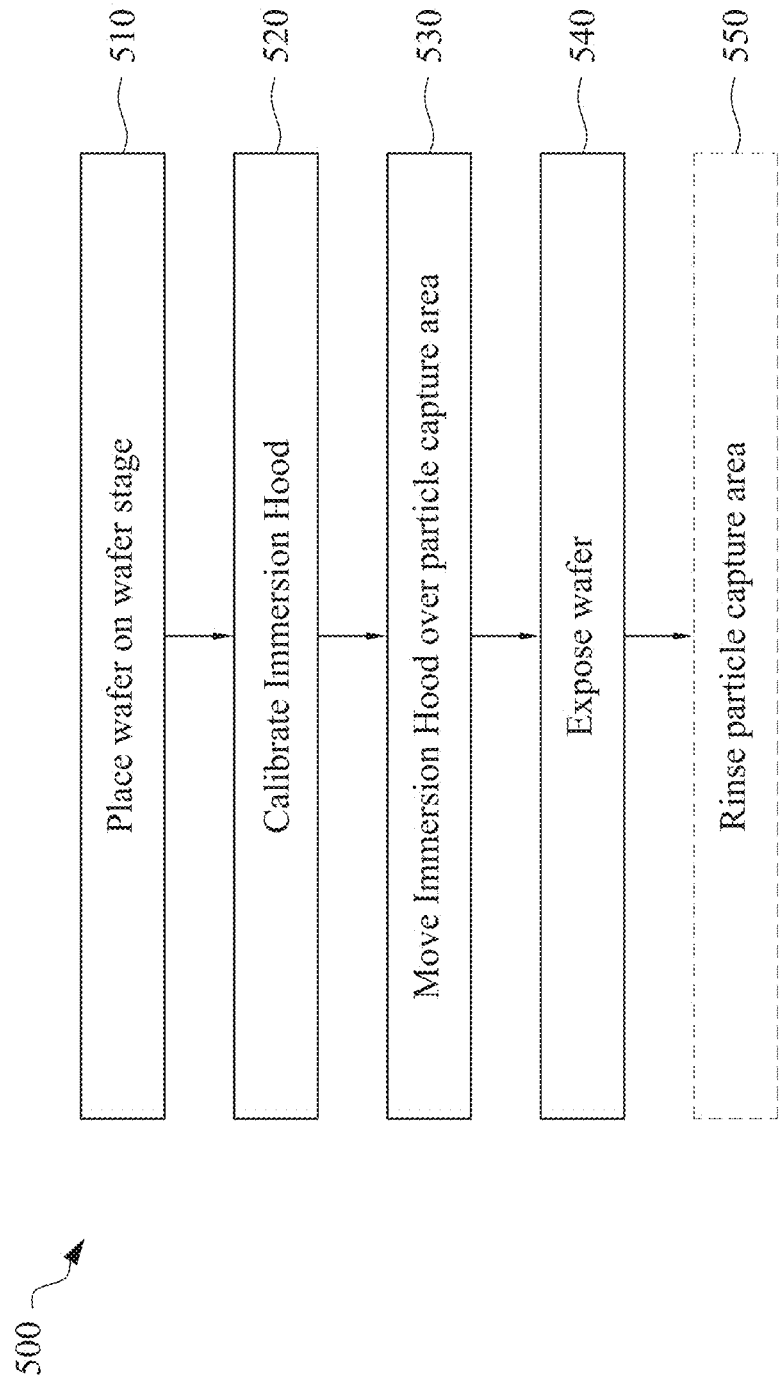
FIG. 5 is a flow chart of a method of using an immersion lithography system in accordance with some embodiments.

FIG. 5 is a flowchart of a method 500 of using an immersion lithography system in accordance with some embodiments. The method 500 is usable with the system 100 (FIG. 1), the wafer stage 200A-200C (FIGS. 2A-2C) and/or the system 400 (FIG. 4). In operation 510, a wafer, e.g., the wafer 112 (FIG. 1), is placed on a wafer stage, e.g., the wafer stage 110 (FIG. 1). The wafer stage has a particle capture area over a portion of a top surface of the wafer stage. In some embodiments, the wafer is placed on the wafer stage using a robot arm. In some embodiments, the wafer is secured the wafer stage using a vacuum chuck. In some embodiments, the wafer stage is movable in a plane parallel to the top surface of the wafer stage. In some embodiments, following operation 510, the wafer and the wafer stage resemble the arrangement in any one of FIGS. 2A-2C.

In operation 520, an immersion hood is calibrated. The immersion hood, e.g., the immersion hood 120 (FIG. 1), is calibrated by positioning the immersion hood above sensors in the wafer stage in order to precisely determine the position of the immersion hood relative to the wafer stage. In some embodiments, the immersion hood is stationary. In some embodiments, the immersion hood is movable. In some embodiments, the immersion hood is calibrated by using a travel path similar to that in FIGS. 2A-2C.

In operation 530, the immersion hood is moved over a particle capture area. The particle capture area, e.g., particle capture area 240 (FIGS. 2A-2C), helps to collector or capture particles over from the wafer stage in order to help prevent those particles from conveying onto the wafer. In some embodiments, the immersion hood is moved over the particle capture area by moving the wafer stage. In some embodiments, the immersion hood is moved over the particle capture area by moving the immersion hood.

The particle capture area extends along the top surface of the wafer stage. The particle capture area is formed by depositing a layer of material over the wafer stage. The material has similar surface characteristics as the wafer. The similar surface characteristics helps the particle capture area to collect particles from the immersion hood accumulated during the calibration movement. In some embodiments, the immersion hood is moved over multiple particle capture areas during operation 530.

In some embodiments, the particle capture area includes silicon or silicon nitride oxide. In some embodiments, the material includes a photoresist material or another suitable material. In some embodiments, a minimum travel distance of the immersion hood over the particle capture area in a first direction is 26 mm. If the travel distance in the first direction is too small, then a risk of particles being conveyed onto the wafer increases, in some instances. In some embodiments, a minimum travel distance of the immersion hood over the particle capture area in a second direction, perpendicular to the first direction, is 33 mm. If the minimum travel distance in the second direction is too small, then a risk of particles being conveyed onto the wafer increases, in some instances. In some embodiments, the immersion hood moves over the particle capture area in a manner similar to at least one of the routing paths in FIGS. 3A-3F. In some embodiments, the immersion hood moves over the particle capture area in a manner different from the routing paths in FIGS. 3A-3F.

In operation 540, the wafer is exposed. The wafer is exposed by transmitting a patterned light beam out of a lens system, e.g., the lens system 125 (FIG. 1), of the immersion hood; through an immersion fluid, e.g., the immersion fluid 140 (FIG. 1), to the wafer. The patterned light beam is scanned over the surface of the wafer by relative movement between the wafer stage and the immersion hood. The patterned light beam imparts a patterning to a photosensitive layer on the wafer.

In optional operation 550, the particle capture area is rinsed. Rinsing the particle collection area following exposure of the wafer helps to reduce the risk of particles accumulating in the particle capture area later being conveyed onto another wafer. In some embodiments, the particle capture area is rinsed using the immersion fluid. For example, the immersion fluid is passed over the wafer stage at a high flow rate or pressure after removal of the wafer from the wafer stage. In some embodiments, the particle capture area is rinsed using water, de-ionized water or another suitable rinse material. In some embodiments, a mechanical wiping process is used to rinse the particle capture area. In some embodiments, the operation 550 is omitted. For example, in some embodiments where the wafer is rinsed as part of the exposure process, such a rinsing process will also rinse the particle capture area and the separate operation 550 is omitted.

Figure 6:
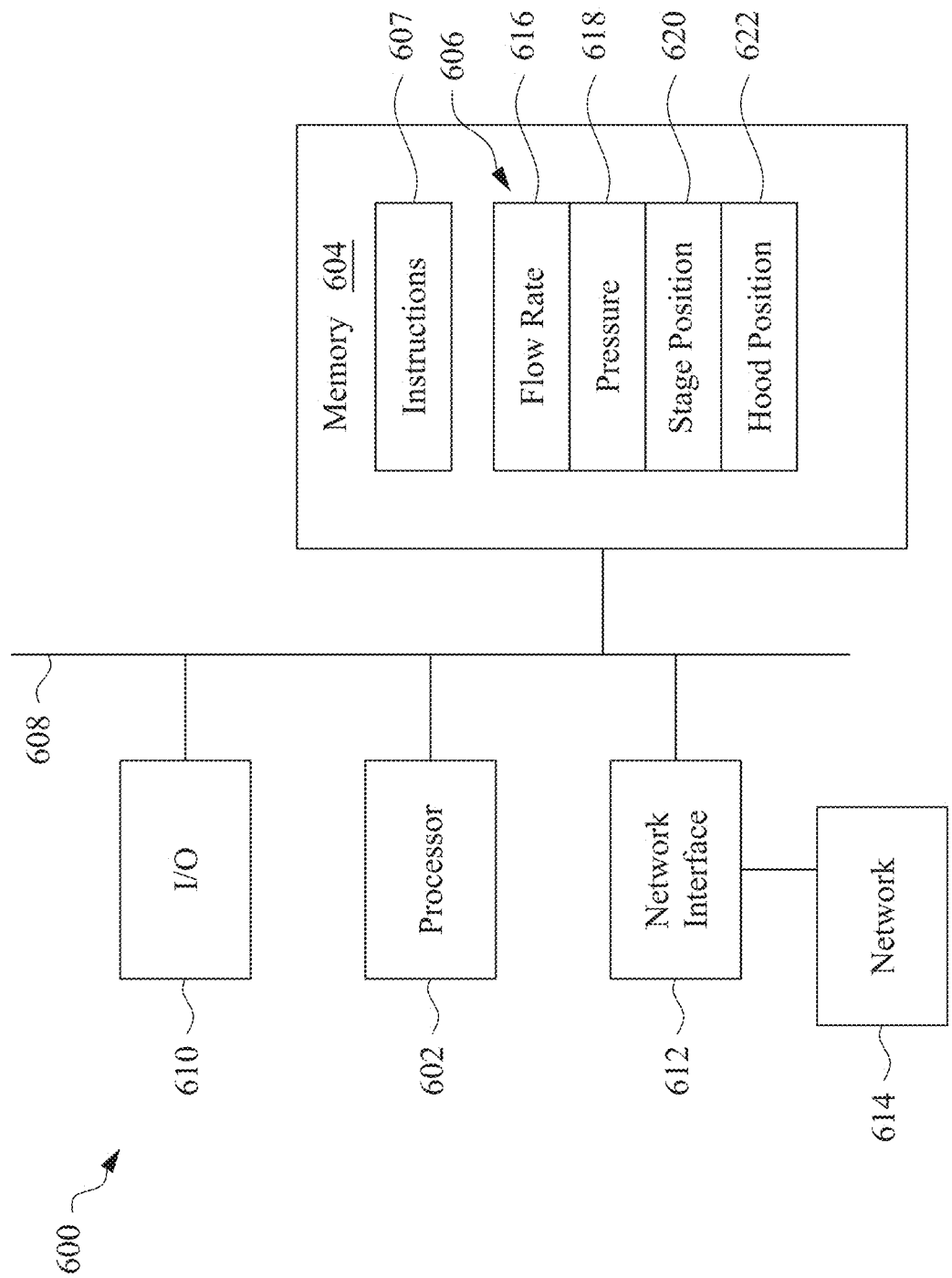
FIG. 6 is a schematic view of a controller for controlling an immersion lithography system in accordance with some embodiments.

FIG. 6 is a schematic view of a controller 600 for controlling an immersion lithography system in accordance with some embodiments The controller 600 includes a hardware processor 602 and a non-transitory, computer readable storage medium 604 encoded with, i.e., storing, the computer program code 606, i.e., a set of executable instructions. Computer readable storage medium 604 is also encoded with instructions 607 for interfacing with manufacturing machines, such as motors, pumps, etc. The processor 602 is electrically coupled to the computer readable storage medium 604 via a bus 608. The processor 602 is also electrically coupled to an I/O interface 610 by bus 608. A network interface 612 is also electrically connected to the processor 602 via bus 608. Network interface 612 is connected to a network 614, so that processor 602 and computer readable storage medium 604 are capable of connecting to external elements via network 614. The processor 602 is configured to execute the computer program code 606 encoded in the computer readable storage medium 604 in order to cause the controller 600 to be usable for performing a portion or all of the operations as described in method 500 or with respect to the system 400.

In some embodiments, the processor 602 is a central processing unit (CPU), a multi-processor, a distributed processing system, an application specific integrated circuit (ASIC), and/or a suitable processing unit.

In some embodiments, the computer readable storage medium 604 is an electronic, magnetic, optical, electromagnetic, infrared, and/or a semiconductor system (or apparatus or device). For example, the computer readable storage medium 604 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 604 includes a compact disk-read only memory (CD-ROM), a compact disk-read/write (CD-R/W), and/or a digital video disc (DVD).

In some embodiments, the storage medium 604 stores the computer program code 606 configured to cause the controller 600 to perform the method 500 or the operations of the system 400. In some embodiments, the storage medium 604 also stores information needed for performing the method 500 or actions of the system 400 as well as information generated during that performance, such as a flow rate parameter 616, a pressure parameter 618, a stage position parameter 620, a hood position parameter 622 and/or a set of executable instructions to perform the operation of the method 500 or the system 400.

In some embodiments, the storage medium 604 stores instructions 607 for interfacing with manufacturing machines. The instructions 607 enable processor 602 to generate manufacturing instructions readable by the manufacturing machines to effectively implement the method 500 or actions of the system 400 during a manufacturing process.

The controller 600 includes I/O interface 610. I/O interface 610 is coupled to external circuitry. In some embodiments, I/O interface 610 includes a keyboard, keypad, mouse, trackball, trackpad, and/or cursor direction keys for communicating information and commands to processor 602.

The controller 600 also includes network interface 612 coupled to the processor 602. Network interface 612 allows the controller 600 to communicate with network 614, to which one or more other computer systems are connected. Network interface 612 includes wireless network interfaces such as BLUETOOTH, WIFI, WIMAX, GPRS, or WCDMA; or wired network interface such as ETHERNET, USB, or IEEE-1394. In some embodiments, the method 500 or the system 400 is implemented in two or more controllers 600, and information such as flow rate, pressure, stage position and hood position are exchanged between different controllers 600 via network 614.

The controller 600 is configured to receive information related to a flow rate of an immersion fluid, e.g., the immersion fluid 140 (FIG. 1). The flow rate is then stored in computer readable medium 604 as flow rate parameter 616. The controller 600 is configured to receive information related to immersion fluid pressure through I/O interface 610 or the network interface 612. The information is stored in computer readable medium 604 as pressure parameter 618. The controller 600 is configured to receive information related to a position of a wafer stage, e.g., the wafer stage 110 (FIG. 1), through I/O interface 610 or the network interface 612. The information is stored in computer readable medium 604 as stage position parameter 620. The controller 600 is configured to receive information related to a position of an immersion hood, e.g., immersion hood 120 (FIG. 1), through I/O interface 610 or the network interface 612. The information is stored in computer readable medium 604 as hood position parameter 622.

During operation, processor 602 executes a set of instructions to determine a relative position of the immersion hood and the wafer stage in order to route the immersion hood over a particle capture area prior to moving the immersion hood over a wafer on the wafer stage. The processor 602 also executes instructions for controlling a flow rate and pressure of the immersion fluid during relative movement of the immersion hood and exposure of the wafer.

An aspect of this description relates to an immersion lithography system. The immersion lithography system includes an immersion hood, wherein the immersion hood includes a lens system. The immersion lithography system further includes a wafer stage, wherein the wafer stage is moveable relative to the immersion hood, and the wafer stage includes an area for receiving a wafer. The immersion lithography system further includes a first particle capture area on the wafer stage outside of the area for receiving the wafer, wherein the first particle capture area includes silicon, silicon nitride oxide or a photoresist material. In some embodiments, the first particle capture area includes silicon nitride oxide. In some embodiments, a dimension of the first particle capture area in a first direction parallel to a top surface of the wafer stage is at least 26 millimeters (mm). In some embodiments, a dimension of the first particle capture area in a second direction parallel to the top surface of the wafer stage is at least 33 mm, and the second direction is perpendicular to the first direction. In some embodiments, the immersion lithography system further includes a second particle capture area on the wafer stage. In some embodiments, the second particle capture area includes a different material from the first particle capture area. In some embodiments, the second particle capture area has a different size than the first particle capture area. In some embodiments, the second particle capture area is along a same side of the wafer stage as the first particle capture area. In some embodiments, the second particle capture area is along a different side of the wafer stage from the first particle capture area.

An aspect of this description relates to a wafer stage. The wafer stage includes an area for receiving a wafer. The wafer stage further includes a first sensor outside of the area for receiving the wafer. The wafer stage further includes a second sensor outside of the area of receiving the wafer, wherein the second sensor is spaced from the first sensor. The wafer stage further includes a first particle capture area outside of the area for receiving the wafer, wherein the first particle capture area is spaced from both the first sensor and the second sensor, a dimension of the first particle capture area in a first direction parallel to a top surface of the wafer stage is at least 26 millimeters (mm), a dimension of the first particle capture area in a second direction parallel to the top surface of the wafer stage is at least 33 mm, and the second direction is perpendicular to the first direction. In some embodiments, the first particle capture area comprises silicon, silicon nitride oxide or a photoresist material. In some embodiments, the wafer stage further includes a second particle capture area outside of the area for receiving the wafer, wherein the second particle capture area is spaced form the first particle capture area, the first sensor and the second sensor. In some embodiments, a dimension of the second particle capture area in the first direction is at least 33 mm. In some embodiments, a dimension of the second particle capture area in the second direction is at least 26 mm.

An aspect of this description relates to a method of using an immersion lithography system. The method includes calibrating an immersion hood by moving a wafer stage in a plane parallel to a top surface of the wafer stage. The method further includes moving the wafer stage to position the immersion hood over a particle capture area on the wafer stage. The method further includes moving the wafer stage to define a two-dimensional routing track over the particle capture area. The method further includes moving the wafer stage to position the immersion hood over a wafer on the wafer stage after defining the two-dimensional routing track over the particle capture area. In some embodiments, moving the wafer stage to define the two-dimensional routing track includes moving the wafer stage in a first direction a total distance of at least 26 millimeters (mm). In some embodiments, moving the wafer stage to define the two-dimensional routing track includes moving the wafer stage in a second direction a total distance of at least 33 mm, and the second direction is perpendicular to the first direction. In some embodiments, moving the wafer stage to define the two-dimensional routing track includes defining the two-dimensional routing track having an L-shape, a U-shape or an S-shape. In some embodiments, moving the wafer stage to define the two-dimensional routing track includes moving the wafer stage at a velocity ranging from about 0.001 mm/s to about 1 mm/s. In some embodiments, the method further includes exposing the wafer using a light beam from the immersion hood, wherein the light beam has a wavelength of 193 nanometers (nm).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An immersion lithography system comprising:
   an immersion hood, wherein the immersion hood comprises a lens system;
   a wafer stage, wherein the wafer stage is moveable relative to the immersion hood, and the wafer stage comprises an area for receiving a wafer; and
   a first particle capture area on the wafer stage outside of the area for receiving the wafer in a direction parallel to a top surface of the wafer stage, wherein the first particle capture area comprises silicon, silicon nitride oxide or a photoresist material, and the first particle capture area fails to surround the wafer stage.

2. The immersion lithography system of claim 1, wherein the first particle capture area comprises silicon nitride oxide.

3. The immersion lithography system of claim 1, wherein a dimension of the first particle capture area in a first direction parallel to a top surface of the wafer stage is at least 26 millimeters (mm).

4. The immersion lithography system of claim 3, wherein a dimension of the first particle capture area in a second direction parallel to the top surface of the wafer stage is at least 33 mm, and the second direction is perpendicular to the first direction.

5. The immersion lithography system of claim 1, further comprising a second particle capture area on the wafer stage.

6. The immersion lithography system of claim 5, wherein the second particle capture area comprises a different material from the first particle capture area.

7. The immersion lithography system of claim 5, wherein the second particle capture area has a different size than the first particle capture area.

8. The immersion lithography system of claim 5, wherein the second particle capture area is along a same side of the wafer stage as the first particle capture area.

9. The immersion lithography system of claim 5, wherein the second particle capture area is along a different side of the wafer stage from the first particle capture area.

10. A method of using an immersion lithography system, the method comprising:
    calibrating an immersion hood by moving a wafer stage in a plane parallel to a top surface of the wafer stage;
    moving the wafer stage to position the immersion hood over a particle capture area on the wafer stage;
    moving the wafer stage to define a two-dimensional routing track over the particle capture area; and
    moving the wafer stage to position the immersion hood over a wafer on the wafer stage after defining the two-dimensional routing track over the particle capture area.

11. The method of claim 10, wherein moving the wafer stage to define the two-dimensional routing track comprises moving the wafer stage in a first direction a total distance of at least 26 millimeters (mm).

12. The method of claim 11, wherein moving the wafer stage to define the two-dimensional routing track comprises moving the wafer stage in a second direction a total distance of at least 33 mm, and the second direction is perpendicular to the first direction.

13. The method of claim 10, wherein moving the wafer stage to define the two-dimensional routing track comprises defining the two-dimensional routing track having an L-shape, a U-shape or an S-shape.

14. The method of claim 10, wherein moving the wafer stage to define the two-dimensional routing track comprises moving the wafer stage at a velocity ranging from about 0.001 mm/s to about 1 mm/s.

15. The method of claim 10, further comprising exposing the wafer using a light beam from the immersion hood, wherein the light beam has a wavelength of 193 nanometers (nm).

16. An immersion lithography system comprising:
    an immersion hood, wherein the immersion hood comprises a lens system;
    a wafer stage, wherein the wafer stage is moveable relative to the immersion hood, and the wafer stage comprises an area for receiving a wafer; and
    a plurality of particle capture areas on the wafer stage, wherein each of the plurality of particle capture areas are separate from the area for receiving the wafer in a direction parallel to a top surface of the wafer stage, each of the plurality of particle capture areas independently comprises silicon, silicon nitride oxide or a photoresist material, and a first particle capture area of the plurality of particle capture areas is discontinuous with all other particle capture areas of the plurality of particle capture areas.

17. The immersion lithography system of claim 16, wherein a first particle capture area of the plurality of particle capture areas comprises a material different from a material of a second particle capture area of the plurality of particle capture areas.

18. The immersion lithography system of claim 16, wherein a first particle capture area of the plurality of particle capture areas is along a same edge of the wafer stage as a second particle capture area of the plurality of particle capture areas.

19. The immersion lithography system of claim 16, wherein a first particle capture area of the plurality of particle capture areas is along a different edge of the wafer stage from a second particle capture area of the plurality of particle capture areas.

20. The immersion lithography system of claim 16, wherein each of the plurality of particle capture areas comprise a same material.

\* \* \* \* \*